United States Patent
Henstra et al.

(10) Patent No.: US 10,559,448 B2
(45) Date of Patent: Feb. 11, 2020

(54) TRANSMISSION CHARGED PARTICLE MICROSCOPE WITH IMPROVED EELS/EFTEM MODULE

(71) Applicant: FEI Company, Hillsboro, OR (US)

(72) Inventors: Alexander Henstra, Hillsboro, OR (US); Peter Christiaan Tiemeijer, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/210,531

(22) Filed: Dec. 5, 2018

(65) Prior Publication Data

US 2019/0180973 A1    Jun. 13, 2019

(30) Foreign Application Priority Data

Dec. 7, 2017  (EP) .................................. 17205782

(51) Int. Cl.
*H01J 37/10* (2006.01)
*H01J 37/147* (2006.01)
(Continued)

(52) U.S. Cl.
CPC ............ *H01J 37/10* (2013.01); *H01J 37/147* (2013.01); *H01J 37/21* (2013.01); *H01J 37/226* (2013.01);
(Continued)

(58) Field of Classification Search
CPC .......... H01J 37/10; H01J 37/147; H01J 37/21; H01J 37/226; H01J 37/265;
(Continued)

(56) References Cited

U.S. PATENT DOCUMENTS

2011/0278451 A1* 11/2011 Tiemeijer ............... H01J 37/05
                                                              250/307

* cited by examiner

*Primary Examiner* — Nicole M Ippolito
*Assistant Examiner* — Hanway Chang

(57) ABSTRACT

A method of using a Transmission Charged Particle Microscope comprising:
A specimen holder, for holding a specimen;
A source, for producing a beam of charged particles;
An illuminator, for directing said beam so as to irradiate the specimen;
An imaging system, for receiving a flux of charged particles transmitted through the specimen and directing it onto a sensing device;
A controller, for controlling at least some operational aspects of the microscope,
in which method the sensing device is chosen to be an EELS/EFTEM module comprising:
An entrance plane;
An image plane, where in EELS mode an EELS spectrum is formed and in EFTEM mode an EFTEM image is formed;
A slit plane between said entrance plane and image plane, where in EFTEM mode an energy dispersed focus is formed;
A dispersing device, between said entrance plane and slit plane, for dispersing an incoming beam into an energy-dispersed beam with an associated dispersion direction;
A first series of quadrupoles between said dispersing device and slit plane;
A second series of quadrupoles between said slit plane and image plane,
which dispersing device and quadrupoles are arranged along an optical axis,
whereby, for a Cartesian coordinate system (X,Y,Z) in which said optical axis is disposed along Z, said dispersion direction is defined as being parallel to X, (Continued)

Figure 1:
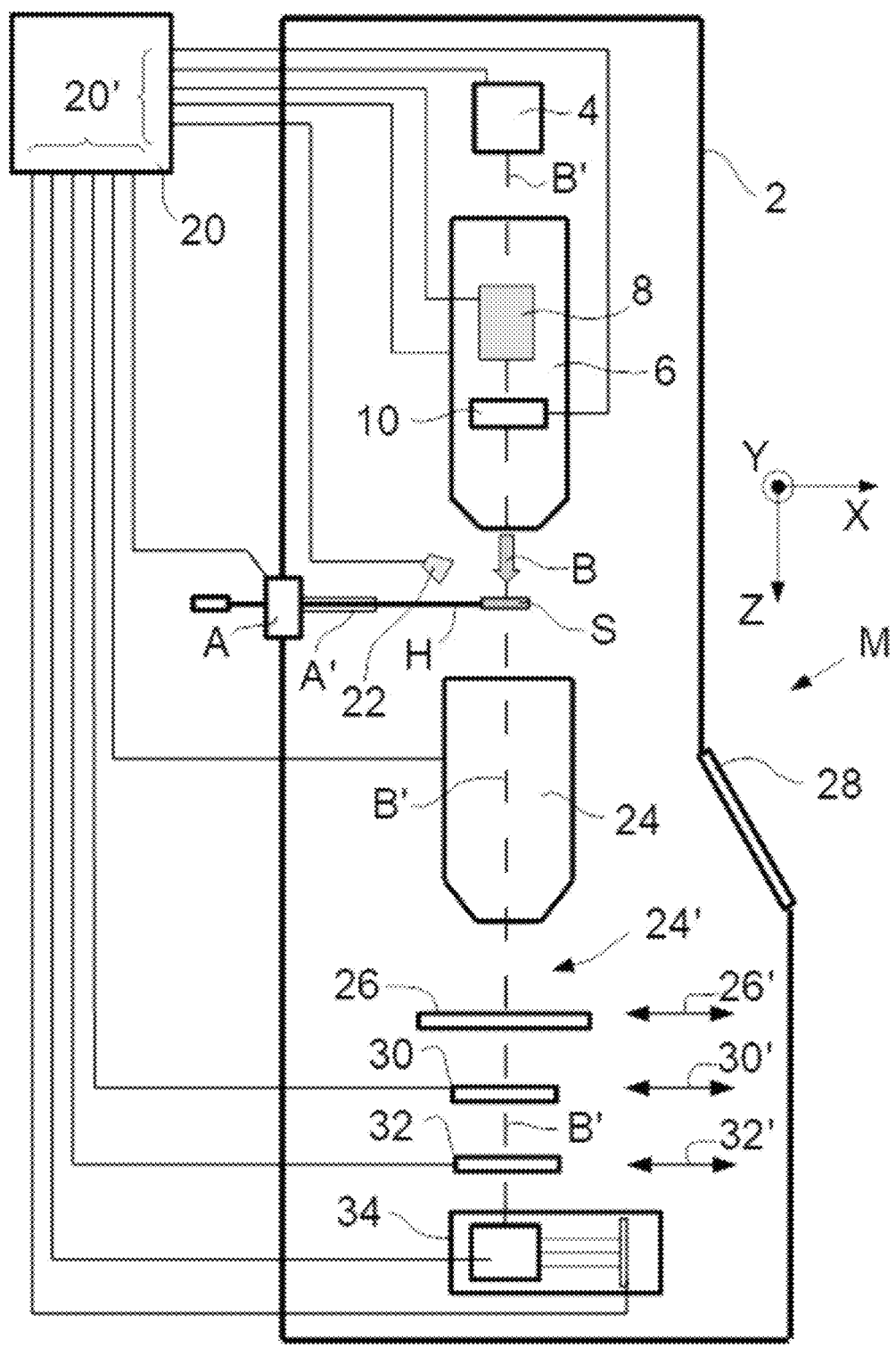

comprising the following steps:

In said first quadrupole series, exciting one or more quadrupoles so as to deflect an off-axis non-dispersive YZ ray leaving said dispersing device onto a path paraxial to said optical axis from said slit plane to said image plane;

In said second quadrupole series, exciting either:

(a) A single quadrupole; or (b) A pair of adjacent quadrupoles, so as to focus said energy-dispersed beam onto said image plane.

9 Claims, 4 Drawing Sheets

(51) Int. Cl.
*H01J 37/21* (2006.01)
*H01J 37/22* (2006.01)
*H01J 37/26* (2006.01)
*H01J 49/06* (2006.01)
*H01J 49/44* (2006.01)

(52) U.S. Cl.
CPC .......... *H01J 37/265* (2013.01); *H01J 49/063* (2013.01); *H01J 49/44* (2013.01); *H01J 2237/24485* (2013.01); *H01J 2237/2802* (2013.01)

(58) Field of Classification Search
CPC ..... H01J 2237/24485; H01J 2237/2802; H01J 49/063; H01J 49/44
USPC .... 250/305, 306, 307, 309, 310, 311, 396 R, 250/397, 398, 396 ML
See application file for complete search history.

TRANSMISSION CHARGED PARTICLE MICROSCOPE WITH IMPROVED EELS/EFTEM MODULE

The invention relates to a method of using a Transmission Charged Particle Microscope comprising:
  A specimen holder, for holding a specimen;
  A source, for producing a beam of charged particles;
  An illuminator, for directing said beam so as to irradiate the specimen;
  An imaging system, for receiving a flux of charged particles transmitted through the specimen and directing it onto a sensing device;
  A controller, for controlling at least some operational aspects of the microscope,
in which method the sensing device is chosen to be an EELS./EFTEM module comprising:
  An entrance plane;
  An image plane, where in EELS mode an EELS spectrum is formed and in EFTEM mode an EFTEM image is formed;
  A slit plane between said entrance plane and image plane, where in EFTEM mode an energy dispersed focus is formed;
  A dispersing device, between said entrance plane and slit plane, for dispersing an incoming beam into an energy-dispersed beam with an associated dispersion direction;
  A first series of quadrupoles between said dispersing device and slit plane;
  A second series of quadrupoles between said slit plane and image plane,
which dispersing device and quadrupoles are arranged along an optical axis,
whereby, for a Cartesian coordinate system (X,Y,Z) in which said optical axis is disposed along Z, said dispersion direction is defined as being parallel to X.

The invention also relates to a Transmission Charged Particle Microscope in which such a method can be enacted.

In this context, it should be noted that:
  EELS and EFTEM are conventional acronyms, with the following respective meanings:
    EELS: Electron Energy-Loss Spectroscopy;
    EFTEM: Energy-Filtered Transmission Electron Microscopy.
  An EELS/EFTEM module as alluded to here is sometimes embodied as a so-called Post-Column Filter (PCF), though this does not necessarily have to be the case.
  The term "quadrupole" as referred to here refers to a lens element that produces a quadrupole (magnetic or electric) field when excited. In terms of physical structure, such a lens element may, in fact, be a multipole (such as an octupole or dodecapole/12-pole) with more than four poles, as long as a number of poles of that multipole can be excited simultaneously so as to produce a quadrupole field. Such a multipole may, if desired, be excited so as to have a hybrid effect, e.g. concurrently producing a quadrupole lens field and a hexapole aberration correction field, for instance.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
  In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
  In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions (such as oxygen), protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, studying ion channeling/ion backscattering (Rutherford Backscattering Spectrometry), etc.

In all cases, a Transmission Charged Particle Microscope (TCPM) will comprise at least the following components:
  A particle source, such as a Schottky electron source or ion source.
  An illuminator (charged particle beam column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
  A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When intended to hold cryogenic specimens, the specimen holder can be provided with a suitable cooling device.
  An imaging system, which essentially takes charged particles that are transmitted through a specimen (plane) and directs (focuses) them onto a sensing device, such as a detection/imaging device (camera), spectral apparatus EELS/EFTEM module, etc. As with the illuminator referred to above, the imaging system may also perform other functions, such as aberration mitigation, cropping, filtering, etc., and it will generally comprise one or more charged-particle lenses and/or other types of particle-optical components.

An EELS/EFTEM module as referred to here will generally comprise:

A dispersing device (e.g. comprising one or more "charged-particle prisms"), to disperse an incoming flux of charged particles (from the imaging system) into an energy-resolved (continuous) array of spectral sub-beams, which can ultimately be directed onto a detection surface so as to form a spectrum. Basically, said incoming flux will contain charged particles of various energies, and the dispersing device will "fan these out"—along a dispersion direction—into a (continuous) collection/array of sub-beams of given energies (in a manner somewhat reminiscent of a mass spectrometer). As set forth above, the X direction is considered to be said dispersion direction, and the associated Y direction to be the so-called non-dispersion direction (although a small amount of "parasitic" dispersion may occur parallel to Y, as a result of aberrations, for example). Often—though not necessarily—the azimuthal orientation of the focusing/magnifying quadrupoles with respect to the Z-axis is chosen such that the two optical symmetry planes of these quadrupoles coincide with the XZ-plane and the YZ-plane. This has the advantage that the dispersive action, which is only present in the XZ-plane at the exit of the dispersing device, remains absent from the YZ-plane throughout the whole optical path downstream of this device.

It should be noted that the employed sensing device may be unitary or compound/distributed in nature, and can take many different forms, depending on what it is intended to sense. It may, for example, comprise one or more photodiodes, CMOS detectors, CCD detectors, photovoltaic cells, etc.

In what follows, the invention may be set forth in the specific context of electron microscopy; however, such simplification is intended for clarity/illustrative purposes, and should not necessarily be interpreted as limiting.

EELS is a technique used in (S)TEMs to obtain elemental/chemical information pertaining to a given specimen. A moving electron in an irradiating beam (from the (S)TEM's illuminator) can transfer energy to a bound electron in a core shell of an atom in the specimen, and promote this core electron to an outer shell (inelastic scattering). This energy transfer from the moving electron gives rise to a so-called "core-loss peak" (CLP) in the EELS spectrum. The (coarse) position (in energy units) of the CLP is element-specific, and its precise position and shape are specific to the element's chemical environment and bonding. In addition to the CLPs referred to above, an EELS spectrum will generally also contain so-called "Plasmon Resonance Peaks" (PRPs), i.e. a relatively broad series of peaks/shoulders associated with single or multiple scattering of electrons on plasmons in the specimen. These PRPs typically lie in the energy range 0-50 eV. Typically, EELS modules can also be used as energy-selective imaging devices (EFTEM functionality). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-dispersion optics. On the other hand, when the module is used as an energy-selective imaging device, the slit can be invoked to pass/admit only a specific energy window (typically of the order of 10-50 eV wide); in that case, the post-dispersion (post-slit) optics then image a Fourier Transform plane of said spectrum plane onto the employed detector.

In an EELS/EFTEM module as set forth above, various quadrupoles are employed to magnify and focus the dispersion produced by the dispersing device (prism). The skilled artisan will realize that these quadrupoles have inherent and parasitic aberrations, such as chromatic aberrations (caused by the dependence of the focusing power of the quadrupoles on the energy of the electrons in the beam) and higher-order aberrations caused by the non-zero length/thickness of the quadrupoles and by fringe fields at the entrance and exit of the quadrupoles. The dispersing device also has inherent and parasitic aberrations. In order to address such aberrations, it is conventional to employ one or more dedicated "clean-up" multipole fields (e.g. generated by octupoles/hexapoles) in the EELS/EFTEM module. To express how well an EELS/EFTEM module can record a relatively large part of the energy-loss spectrum in a single image, it is convenient to introduce a (relativistic) "energy parameter":

$$\frac{\Delta E_r}{E_r} = \frac{1 + \frac{E}{mc^2}}{1 + \left(\frac{E}{2mc^2}\right)} \frac{\Delta E}{E}$$

in which E is the primary (input) beam energy (typically somewhere between 20 keV and 1000 keV), m is the electron mass, c is the speed of light, and $\Delta E$ is the detected spectral energy spread; for a given choice of optical path in the EELS/EFTEM module, this parameter is nominally independent of E. If one now considers "conventional" EELS to be associated with $\Delta E_r/E_r \leq$ ca. 0.01 and "Large-Energy-Range" EELS (LER-EELS) to correspond to $\Delta E_r/E_r >$ ca. 0.01, then, with this convention in mind, it can be remarked that the aforementioned "clean-up" multipole fields can achieve relatively satisfactory results when performing "conventional" EELS, but tend to offer sub-optimal results for LER-EELS—in which (chromatic) aberrations tend to be relatively severe in parts of the spectrum near the outskirts of the employed detector. This is unfortunate, since LER-EELS can, for example, be potentially advantageous in circumstances such as the following:

When analyzing a specimen comprising one or more constituents with elemental peaks spread across a wide energy range ($\Delta E$), e.g. a compound comprising carbon, iron and aluminum, which has peaks at ca. 300 eV, 700 eV and 1550 eV.

If one wishes to use a relatively low primary beam energy (E<100 keV, for instance), ag, so as to reduce radiative damage to the specimen; reducing the primary beam energy will widen the spectrum projected onto the image plane.

When using so-called "direct detection" cameras, which can produce a satisfactory output with only relatively few electrons per detection channel; such a detector can therefore quickly and accurately register a relatively spread-out spectrum, with an attendant throughput improvement.

For more information, see, for example, US 2017/0125210 A1 (incorporated herein by reference), which has the same inventors as the present invention.

It is an object of the invention to address these issues. More specifically, it is an object of the invention to provide a method/apparatus as set forth above, which suffers to a lesser extent from the aforementioned aberrations. In particular, it is an object of the invention that the new method/apparatus should yield satisfactory results for LER-EELS.

These and other objects are achieved in a method as set forth in the opening paragraph above, characterized by the following steps:

In said first quadrupole series, exciting one or more quadrupoles so as to deflect an off-axis non-dispersive YZ ray leaving said dispersing device onto a path paraxial to said optical axis from said slit plane to said image plane;

In said second quadrupole series, exciting either:
(a) A single quadrupole; or
(b) A pair of adjacent quadrupoles,
so as to focus said energy-dispersed beam onto said image plane.

As here referred to:
A ray is considered to be "off-axis" when it enters the dispersing device at a position removed from the Z-axis. When a ray is not "off-axis" it is (implicitly assumed to be) on-axis, that is, it enters the dispersing device on the Z-axis.
A ray is called "dispersive" when it travels with energy E-dE, having incurred an energy loss dE. When a ray is not dispersive, it is (implicitly assumed to be) "non-dispersive", and travels with nominal energy E.
A "YZ-ray" is considered to travel purely in the YZ plane at the location of the slit plane; similarly, an "XZ-ray" is considered to travel purely in the XZ-plane at the location of the slit plane.
The skilled artisan will understand that the technical term "paraxial" includes rays that are close/proximal to the optical axis/Z-axis (and substantially parallel thereto), or/and that substantially coincide with the optical axis/Z-axis.

Figure 3A:
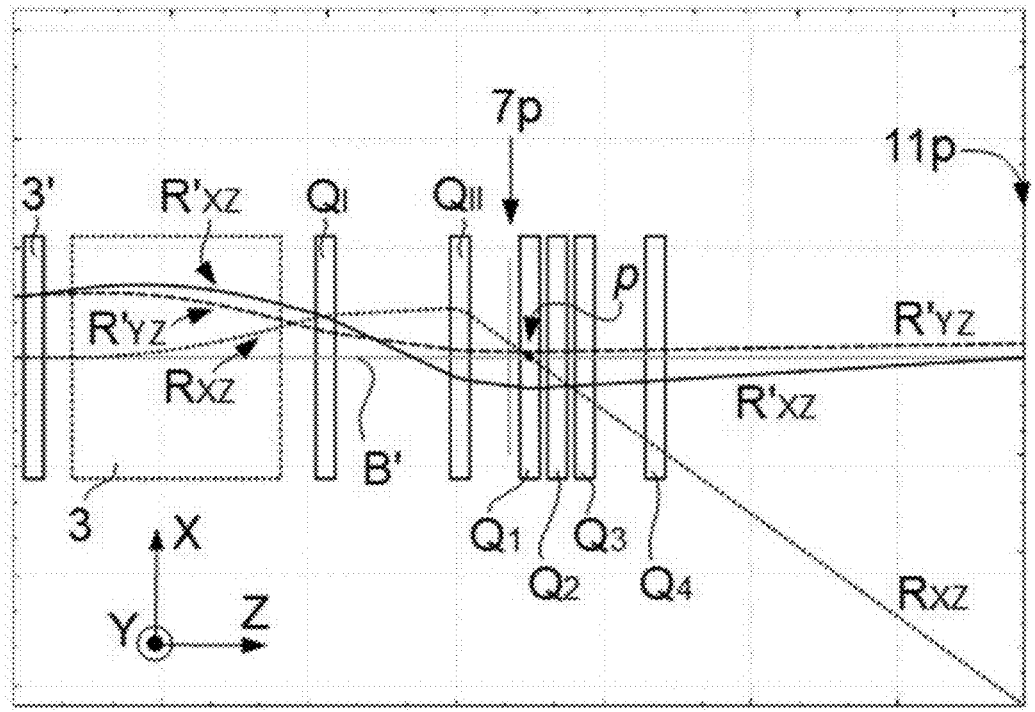
Figure 3B:
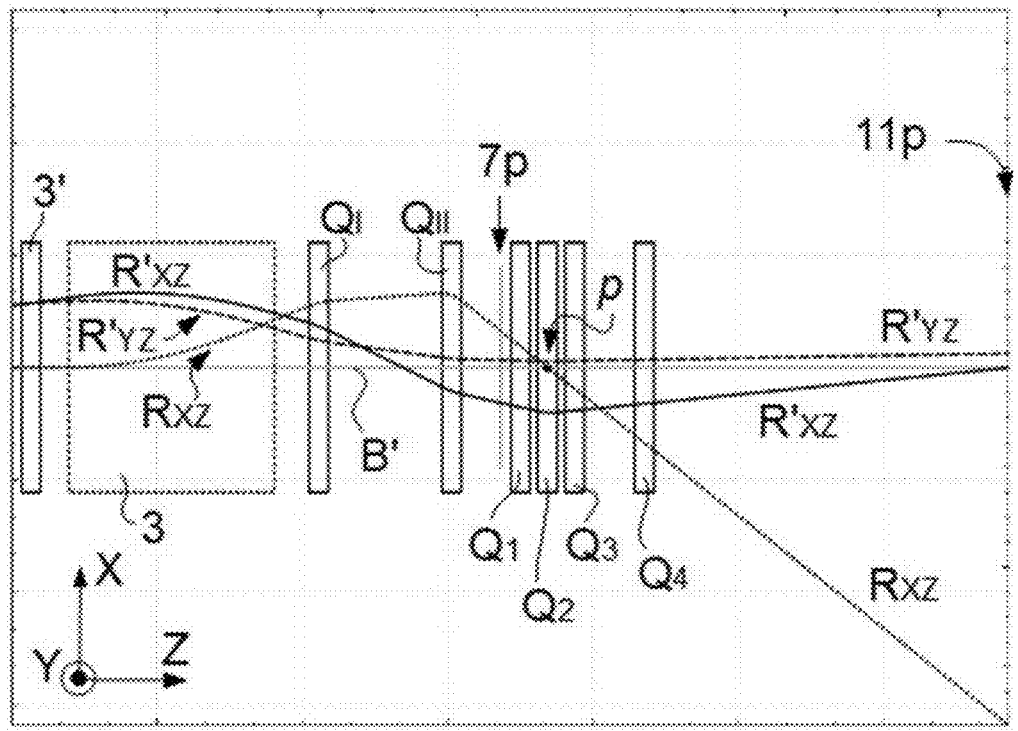
Figure 3C:
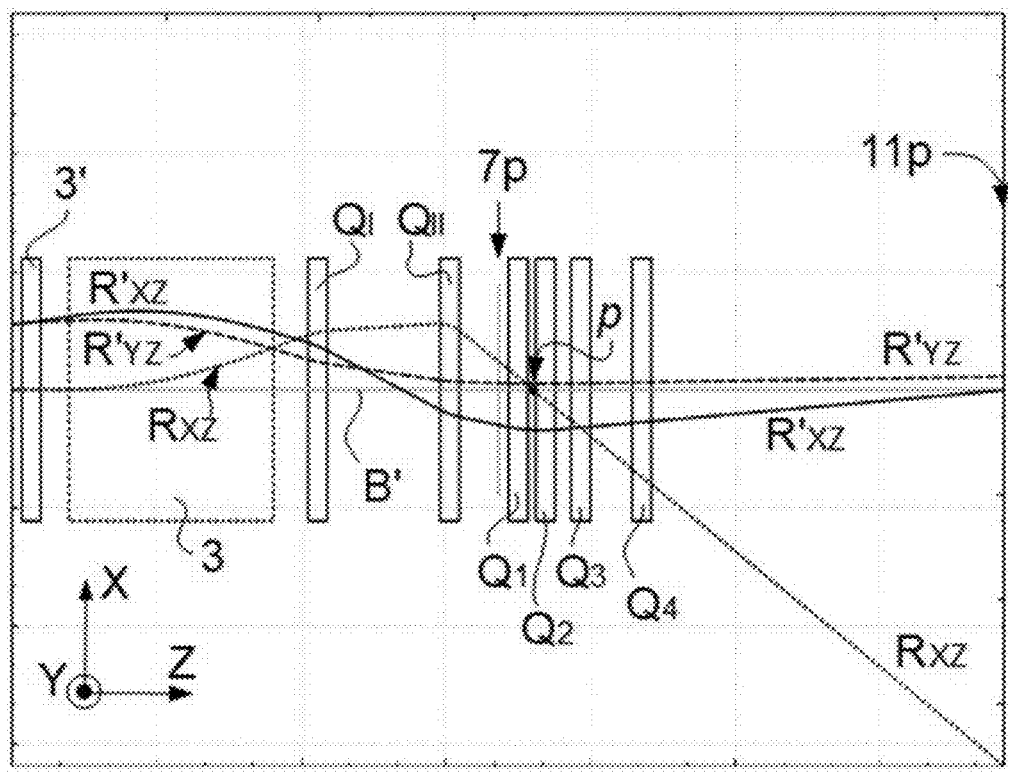

See FIGS. 3A-3C, for example.

The invention exploits the insight that, by maintaining off-axis non-dispersive rays vicinal to the Z-axis in the "post-slit" space between the slit plane and image plane, one can suffice with excitation of a minimal number of quadrupoles in said post-slit space—ideally just one quadrupole, but excitation of a pair of adjacent quadrupoles is also a possibility (see below). Although there may be more than two quadrupoles present in the second quadrupole series (see the aforementioned US 2017/0125210 A1, for example, and also FIGS. 3A-3C below), the invention only needs to excite a single one/single adjacent pair of these at any given time. This minimal number of excited quadrupoles in turn leads to minimal quadrupole-associated aberrations. This is a highly innovative solution compared to what has previously been attempted by longstanding practitioners in this field. For example, in the article by A. Gubbens et al., "The GIF Quantum, a next-generation post-column imaging energy filter", *Ultramicroscopy* 110 (2010) pp. 962-970, the authors try to increase ΔE/E (above previously attained values) by reducing the size (bending radius) of the employed dispersing device, thus reducing the magnification at the slit plane (from 5.0× to 3.3×). This results in a 2 keV field of view at 200 kV ($\Delta E_r/E_r$=0.011) and a 682 eV field of view at 60 kV ($\Delta E_r/E_r$=0.012). In contrast, with the present invention, the inventors have achieved $\Delta E_r/E_r$ values well above this limit: see, for example FIGS. 3A-3C, which depict embodiments corresponding to $\Delta E_r/E_r \approx$ 0.033, 0.051 and 0.043, respectively. It is noted that decreasing the size of the dispersing device without decreasing the diameter of the entering beam, as in the abovementioned *Ultramicroscopy*, article leads to increased higher-order aberrations—an undesirable side-effect which the present invention avoids.

In an embodiment of the invention:
An on-axis dispersive ray entering said dispersing device crosses said optical axis at an intersection point p;
In said second quadrupole series, if said intersection point p lies:
Within a given quadrupole, then option (a) is applied to this quadrupole;
Between a pair of adjacent quadrupoles, then option (b) is applied to this pair of quadrupoles.

So as to minimize the number of post-slit quadrupoles excited at any given time, this embodiment uses a geometric recipe to determine which post-slit quadrupoles are best excited in a given situation. The position of intersection point p along the Z-axis will be influenced by the particular details of the selected excitation of the first-series/"pre-slit" quadrupoles, since this determines the "focal length" of the pre-slit optics. In summary:

If the Z-position of point p is such as to place it within (the central region of) a given quadrupole Qa, then excitation of Qa alone is sufficient;

If the Z-position of point p is such as to place it between the members of a given quadrupole pair Qa, Qb, then Qa and Qb are concurrently excited.

With regard to the discussion in the previous paragraph, a simple "rule-of-thumb" linear formula can be expressed for the quadrupole excitation in the second (post-slit) quadrupole series, whereby:

$$e_a d_a = e_b d_b$$

in which:
$e_a$, $e_b$ are respective effective excitations of a pair of adjacent quadrupoles Qa, Qb, (with e=∫dz $\psi_Q(z)$, where $\psi_Q(z)$ is the axial quadrupole field);
$d_a$, $d_b$ are respective axial distances of intersection point p from a center of each of quadrupoles Qa, Qb (so that $d_a + d_b = d_{ab}$=the axial separation of the centers of Qa and Qb).

As already alluded to above, the skilled artisan will be able to predict/calculate the position of p on the basis of the employed excitations of the quadrupoles in the first (pre-slit) quadrupole series. Excitation according to this formula is the most effective in refocusing the non-dispersive XZ-ray with the least amount of aberrations introduced. However, the skilled artisan will recognize that minor deviations from this formula are possible for the quadrupole settings in the second series, as long as these deviations do not substantially alter the rays in the second series. The skilled artisan will also understand that both quadrupoles Qa, Qb can be excited with the same polarity (e.g. positive); alternatively, one could, for example, choose a scenario whereby $e_a \sim$+100% and $e_b \sim$−10%, for instance, which still results in a (strong) net positive excitation In an embodiment of the invention, the energy-dispersed beam is de-magnified between said dispersing device and slit plane. In essence, this ensures that, after leaving the dispersion device, the dispersed beam will fit within the confines of the apparatus that has yet to be traversed, particularly:

Fitting within the central bores/vacuum tube of the various (first-series/second-series) quadrupoles;
Fitting within the perimeters of the employed detector/camera.

As regards the degree of paraxiality referred to above, the inventors have examined various scenarios and have observed that, if the non-dispersive YZ ray enters the dispersing device at a distance $d_E$ from the optical axis, and has a maximum distance $d_L$ from the optical axis within the second quadrupole series, then the ratio $d_E/d_L$ is desirably ≥3, preferably ≥5, and more preferably ≥10. Aberrations scaling with the second (or higher) power of this ratio will be correspondingly drastically reduced.

The skilled artisan will understand that the dispersing device used in the present invention can take various different forms, according to choice. For example, it may comprise:
- A single magnetic sector/bending magnet. Typically 90 degrees bending angle is employed, but other bending angles are possible. This is a commonly employed device.
- Similar devices with multiple sectors, e.g. a configuration with four sectors and net deflection of 180 degrees.
- Similar concepts with electrostatic deflection. In practice, electrostatic deflection is not a preferred choice for primary beam energies above about 60 keV.
- A dipole Wien filter, which is a straight-axis device.

The invention will now be elucidated in more detail on the basis of exemplary embodiments and the accompanying schematic drawings, in which:

FIG. 1 renders a longitudinal cross-sectional elevation view of an embodiment of a TCPM in which the present invention is implemented.

Figure 2:
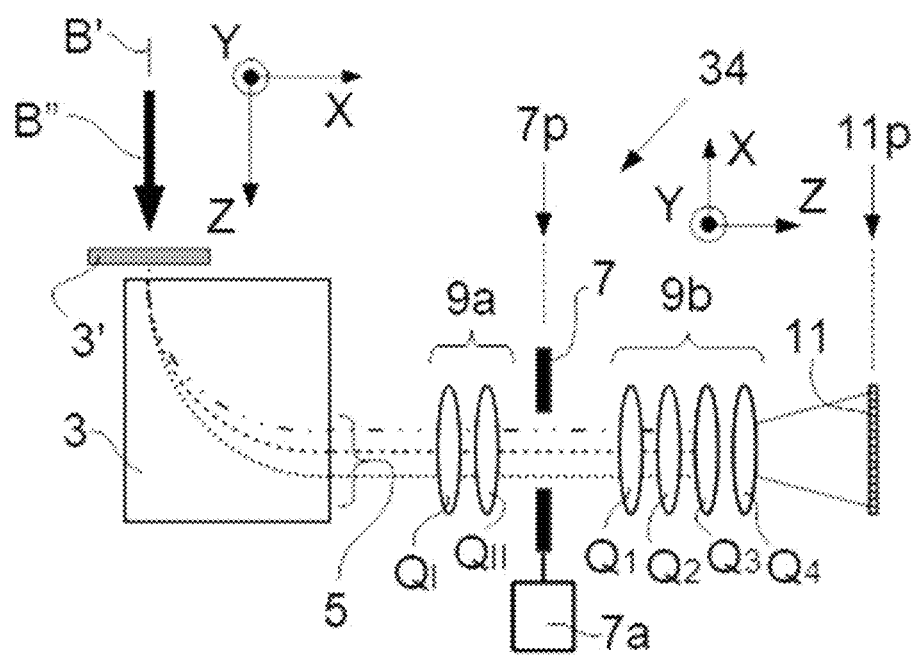

FIG. 2 shows an enlarged and more detailed view of part of FIG. 1, more particularly an EELS/EFTEM module.

FIG. 3A renders an enlarged and more detailed view of part of FIG. 2, for a particular embodiment of the present invention.

FIG. 3B corresponds largely to FIG. 3A, but depicts a different embodiment of the invention.

FIG. 3C corresponds largely to FIGS. 3A/3B, but depicts yet another embodiment of the invention.

In the Figures, where pertinent, corresponding parts are indicated using corresponding reference symbols.

EMBODIMENT 1

FIG. 1 (not to scale) is a highly schematic depiction of an embodiment of a TCPM M in which the present invention is implemented; more specifically, it shows an embodiment of a TEM/STEM. In the Figure, within a vacuum enclosure 2, an electron source 4 produces a beam B of electrons that propagates along an electron-optical axis B' and traverses an electron-optical illuminator (charged particle beam column) 6, serving to direct/focus the electrons onto a chosen part of a specimen S (which may, for example, be (locally) thinned/planarized). Explicitly depicted within illuminator 6 are:
- A deflector 10, which (inter alia) can be used to effect scanning motion of the beam B;
- An optional monochromator 8, which can be used to improve monochromaticity of the beam coming from source 4, though various other optical elements will also typically be present.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y (will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen (sensing device) 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of sensing device can be used downstream of screen 26, such as:
- TEM camera 30. At camera 30, electron flux B" can form a static image or diffractogram that can be processed by controller/processor 20 and displayed on a display device (not depicted), such as a flat panel display, for example. When not required, 30 can be retracted/withdrawn (as schematically indicated by arrows 30') so as to get it out of the way of axis B'.
- STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example: in such a camera, a central hole would allow flux passage when the camera was not in use), As an alternative to imaging using cameras 30 or 32, one can also invoke spectral apparatus 34, which, in the current example, is an EELS/EFTEM module.

It should be noted that the order/location of items 30, 32 and 34 is not strict, and many possible variations are conceivable. For example, spectral apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it closely encapsulates the axis B', taking the form of a small tube (e.g. of the order of 1 cm in diameter) through which the employed electron beam passes, but widening out to accommodate structures such as the source 4, specimen holder H, screen 26, camera 30, camera 32, spectral apparatus 34, etc.

Turning now to FIG. 2, this shows an enlarged and more detailed view of the spectral apparatus 34 in FIG. 1. In the Figure, flux B" of electrons (which has passed through specimen S and imaging system 24) is shown propagating along electron-optical axis B'. The flux B" enters a dispersing device 3 ("electron prism"), where it is dispersed (fanned out) into an energy-resolved/energy-differentiated (continuous) array 5 of spectral sub-beams (schematically indicated in FIG. 2 using broken lines), which are distributed along dispersion direction X. Note in this regard that, conventionally, propagation is considered to occur along the Z direction, and the depicted Cartesian coordinate system thus "co-deflects with" the flux B" within the dispersing device 3. Associated with dispersing device 3 are pre-dispersion optics 3', which will generally comprise one or more multipole elements, for example; these may generate a hexapole field and/or quadrupole field, for example, inter alia for purposes of aberration mitigation.

Downstream of item 3, the array 5 of sub-beams encounters an adjustable/retractable slit (letterbox) 7, which can, for example, be used in EFTEM-mode to select/admit a given portion of the array 5 and to discard/occlude other portions thereof; to this end, the slit 7 is connected to an actuation device 7a that can be invoked to open/close/move the (opening in the) slit 7 as desired. In EELS mode, this slit 7 is usually (fully) open/retracted. The skilled artisan will understand that the slit 7 is advantageously disposed at a location (slit plane 7p) at or proximal to a dispersion plane of the spectral apparatus 34; similarly, detector 11 (in image plane 11p) is also advantageously located at or proximal to such a plane. If required, it is possible to aim/shift the array 5 of spectral sub-beams falling upon the slit 7 by appropriately adjusting, for example, (an electrical signal to) the dispersing device 3 and/or a drift tube/deflector (not depicted) provided between the dispersing device 3 and slit 7, for instance.

Of particular importance in the context of the present invention are the pre-slit optics 9a and post-slit optics 9b, which respectively comprise a first series and second series of quadrupoles (or, more generally formulated, multipoles capable of excitation to produce a quadrupole lensing field). As here depicted—in a particular configuration that should not be interpreted as limiting—the following choices have been made:

Pre-slit optics 9a comprise a first series of two quadrupoles: $Q_I$ and $Q_{II}$;

Post-slit optics 9b comprise a second series of four quadrupoles: $Q_1$, $Q_2$, $Q_3$ and $Q_4$.

These quadrupoles, and associated principal rays, are depicted in greater detail in FIG. 3A, in which the axis B' is illustrated as being straight (for convenience) and in which:

$R_{XZ}$ is an on-axis dispersive ray;

$R'_{YZ}$ is an off-axis non-dispersive ray in the YZ plane;

$R'_{XZ}$ is an off-axis non-dispersive ray in the XZ plane.

In accordance with the invention, note that:

By suitable activation of pre-slit/first-series quadrupoles $Q_I/Q_{II}$, the off-axis non-dispersive ray $R'_{YZ}$ is quickly brought into the vicinity of optical axis B', and is paraxial w.r.t. ("hugs") this axis between planes 7p and 11p.

On-axis dispersive ray $R_{XZ}$ intersects the optical axis B' at intersection point p—which, in the current case, is located at the heart/center of post-slit/second-series quadrupole $Q_1$.

Of the second series of quadrupoles in the post-slit optics 9b, only quadrupole $Q_1$ is excited.

Here, $\Delta E = 8.2$ keV at a primary beam energy $E = 300$ keV (accelerating voltage 300 kV), yielding $\Delta E_r/E_r \approx 0.0335$.

EMBODIMENT 2

FIG. 3B corresponds largely to FIG. 3A, but depicts a different embodiment of the invention. Here:

By suitable activation of pre-slit/first-series quadrupoles the off-axis non-dispersive ray $R'_{YZ}$ again hugs optical axis B' between planes 7p and 11p.

On-axis dispersive ray $R_{XZ}$ intersects the optical axis B' at intersection point p which, in the current case, is located at the heart/center of post-slit/second-series quadrupole $Q_2$.

Now, of the second series of quadrupoles in the post-slit optics 9b, only quadrupole $Q_2$ is excited.

Here, $\Delta E = 12.4$ keV at a primary beam energy $E = 300$ keV, yielding $\Delta E_r/E_r \approx 0.0507$.

EMBODIMENT 3

FIG. 30 corresponds largely to FIGS. 3A/3B, but depicts yet another embodiment of the invention. In this case:

By suitable activation of pre-slit first-series quadrupoles $Q_I/Q_{II}$, the off-axis non-dispersive ray $R'_{YZ}$ once again hugs optical axis B' between planes 7p and 11p.

On-axis dispersive ray $R_{XZ}$ intersects the optical axis B' at intersection point p—which, in the current case, is located between quadrupoles $Q_1$ and $Q_2$.

Now, both quadrupoles $Q_1$ and $Q_2$ are excited (with the same polarity, and with the same strength).

Here, $\Delta E = 10.5$ keV at a primary beam energy $E = 300$ keV, yielding $\Delta E_r/E_r \approx 0.0429$.

Note from a successive comparison of FIGS. 3A, 3C and 3B that, as $\Delta E$ increases, intersection point p moves further to the right along the optical axis.

The invention claimed is:

1. A method of using a Transmission Charged Particle Microscope comprising:
   n imaging system, for receiving a flux of charged particles transmitted through a specimen and directing the flux of charged particles after passing through the specimen onto a sensing device;
   a controller, for controlling at least some operational aspects of the microscope,
in which method the sensing device is chosen to be an EELS/EFTEM module comprising:
   an entrance plane;
   an image plane, where in EELS mode an EELS spectrum is formed and in EFTEM mode an EFTEM image is formed;
   a slit plane between said entrance plane and said image plane, where in EFTEM mode an energy dispersed focus is formed;
   a dispersing device, between said entrance plane and said slit plane, for dispersing an incoming charged particle beam into an energy-dispersed beam with an associated dispersion direction;
   a first series of quadrupoles between said dispersing device and slit plane;
   a second series of quadrupoles between said slit plane and image plane,
which dispersing device and quadrupoles are arranged along an optical axis,
whereby, for a Cartesian coordinate system (X,Y,Z) in which said optical axis is disposed along Z, said dispersion direction is defined as being parallel to X,
wherein:
   in said first quadrupole series, exciting one or more quadrupoles so as to deflect an off-axis non-dispersive YZ ray leaving said dispersing device onto a path paraxial to said optical axis from said slit plane to said image plane; and
   in said second quadrupole series, exciting either:
      (a) a single quadrupole; or
      (b) a pair of adjacent quadrupoles,
      so as to focus said energy-dispersed beam onto said image plane.

2. A method according to claim 1, wherein:
   an on-axis dispersive ray entering said dispersing device crosses said optical axis at an intersection point p;
   in said second quadrupole series, if said intersection point p lies:
      within a given quadrupole, then option (a) is applied to this quadrupole;
      between a pair of adjacent quadrupoles, then option (b) is applied to this pair of quadrupoles.

3. A method according to claim 1, wherein said quadrupole excitation in the second quadrupole series substantially satisfies the formula:

$$e_a d_a = e_b d_b$$

in which:
   $e_a$, $e_b$ are respective effective excitations of a pair of adjacent quadrupoles Qa, Qb;
   $d_a$, $d_b$ are respective axial distances of intersection point p from a center of each of quadrupoles Qa, Qb.

4. A method according to claim 1, wherein, in option (b), both quadrupoles are excited with the same polarity.

5. A method according to claim 1, wherein said energy-dispersed beam is de-magnified between said dispersing device and slit plane.

6. A method according to claim 1, wherein, for a beam energy E and detected spectral energy spread ΔE, an energy parameter $\Delta E_r/E_r$ has a value >0.0125, where:

$$\frac{\Delta E_r}{E_r} = \frac{1 + \frac{E}{mc^2}}{1 + \left(\frac{E}{2mc^2}\right)} \frac{\Delta E}{E}$$

with m the electron mass and c the speed of light.

7. A method according to claim 1, wherein, if said non-dispersive YZ ray enters said dispersing device at a distance $d_E$ from the optical axis, and has a maximum distance $d_L$ from the optical axis within the second quadrupole series, then $d_E/d_L \geq 3$, preferably $\geq 5$, more preferably $\geq 10$.

8. A Transmission Charged Particle Microscope comprising:
   an imaging system, for receiving a flux of charged particles transmitted through a specimen and directing the flux of charged particle after transmitted through the specimen onto a sensing device;
   a controller, for controlling at least some operational aspects of the microscope,
in which the sensing device comprises an EELS/EFTEM module comprising:
   an entrance plane;
   an image plane, where in EELS mode an EELS spectrum is formed and in EFTEM mode an EFTEM image is formed;
   a slit plane between said entrance plane and image plane, where in EFTEM mode an energy dispersed focus is formed;
   a dispersing device, between said entrance plane and slit plane, for dispersing an incoming beam into an energy-dispersed beam with an associated dispersion direction;
   a first series of quadrupoles between said dispersing device and slit plane;
   a second series of quadrupoles between said slit plane and image plane,
which dispersing device and quadrupoles are arranged along an optical axis,
whereby, for a Cartesian coordinate system (X,Y,Z) in which said optical axis is disposed along Z, said dispersion direction is defined as being parallel to X,
wherein said controller is configured to:
   in said first quadrupole series, excite one or more quadrupoles so as to deflect an off-axis non-dispersive YZ ray leaving said dispersing device onto a path paraxial to said optical axis from said slit plane to said image plane; and
   in said second quadrupole series, excite either:
      (a) a single quadrupole; or
      (b) a pair of adjacent quadrupoles,
      so as to focus said energy-dispersed beam onto said image plane.

9. A method comprising:
   exciting a first series of quadrupoles to cause an off-axis, non-dispersive charged particle beam to propagate paraxial to an optical axis, the first series of quadrupoles arranged between a dispersive device and a slit plane; and
   exciting one or more quadrupoles of a second series of quadrupoles in response to a point an on-axis dispersive charged particle beam crosses the optical axis, the point located between the slit plane and an imaging plane, wherein to focus the on-axis dispersive charged particle beam onto the imaging plane, exciting one or more quadrupoles of the second series of quadrupoles includes:

based on the point coinciding with a single quadrupole of the second series of quadrupoles, exciting the single quadrupole of the second series of quadrupoles; and based on the point coinciding with a location between two adjacent quadrupoles of the second series of quadrupoles, exciting the two adjacent quadrupoles of the second series of quadrupoles.

\* \* \* \* \*